(12) United States Patent
Wang et al.

(10) Patent No.: US 10,117,324 B2
(45) Date of Patent: Oct. 30, 2018

(54) SHIELDING CASE, PCB AND TERMINAL DEVICE

(71) Applicant: Xiaomi Inc., Beijing (CN)

(72) Inventors: Dongliang Wang, Beijing (CN); Shaojie Wang, Beijing (CN); Shasha Shi, Beijing (CN)

(73) Assignee: XIAOMI INC., Haidian District, Beijing (CN)

( * ) Notice: Subject to any disclaimer, the term of this patent is extended or adjusted under 35 U.S.C. 154(b) by 80 days.

(21) Appl. No.: 15/077,868

(22) Filed: Mar. 22, 2016

(65) Prior Publication Data
US 2017/0111989 A1    Apr. 20, 2017

(30) Foreign Application Priority Data

Oct. 14, 2015    (CN) .......................... 2015 1 0660841

(51) Int. Cl.
*H05K 5/00*    (2006.01)
*H05K 1/02*    (2006.01)
(Continued)

(52) U.S. Cl.
CPC ......... *H05K 1/0212* (2013.01); *H05K 7/2039* (2013.01); *H05K 7/20418* (2013.01);
(Continued)

(58) Field of Classification Search
CPC ........... H05K 2201/066; H05K 7/2039; H05K 7/20418; H05K 7/20427; H05K 7/20436; H05K 7/20445; H05K 7/20854; H05K 7/209; H05K 7/20963; H05K 2201/0707; H05K 2201/10371; H05K 9/0024; H05K 9/0052; H05K 9/0081; H01L 23/552
(Continued)

(56) References Cited

U.S. PATENT DOCUMENTS 5,717,577 A * 2/1998 Mendolia ............. H05K 9/0028
                                                                174/351
7,623,360 B2    11/2009 English
(Continued)

FOREIGN PATENT DOCUMENTS

CN    103260388 A    8/2013
CN    203136420 U    8/2013
(Continued)

OTHER PUBLICATIONS

International Search Report in international application No. PCT/CN2015/098904, dated Jul. 5, 2016.
(Continued)

*Primary Examiner* — Binh Tran
(74) *Attorney, Agent, or Firm* — Jun He Law Offices P.C.; James J. Zhu

(57) ABSTRACT

Described are a shielding case, a Printed Circuit Board (PCB) and a terminal device. The shielding case includes a first shielding case body (1) and a second shielding case body (2) which are interconnected with each other, wherein the second shielding case body (2) at least partially covers an outside of the first shielding case body (1), and a heat storage material (3) is accommodated between the first shielding case body (1) and the second shielding case body (2).

14 Claims, 1 Drawing Sheet

(51) Int. Cl.
H05K 7/14 (2006.01)
H05K 9/00 (2006.01)
H05K 7/20 (2006.01)

(52) U.S. Cl.
CPC ..... *H05K 7/20427* (2013.01); *H05K 7/20436* (2013.01); *H05K 9/0024* (2013.01); *H05K 9/0052* (2013.01); *H05K 9/0081* (2013.01); *H05K 2201/066* (2013.01); *H05K 2201/0707* (2013.01); *H05K 2201/10371* (2013.01)

(58) Field of Classification Search
USPC ....... 361/712, 719, 722, 752, 753, 758, 800, 361/816, 818; 257/659, 660
See application file for complete search history.

(56) References Cited

U.S. PATENT DOCUMENTS

| | | | | |
|---|---|---|---|---|
| 8,077,479 | B2* | 12/2011 | Ligtenberg | G06F 1/1616 361/799 |
| 2007/0210082 | A1 | 9/2007 | English | |
| 2012/0069522 | A1 | 3/2012 | Hung | |
| 2013/0077282 | A1 | 3/2013 | Malek et al. | |
| 2013/0329369 | A1 | 12/2013 | Chen | |
| 2014/0043769 | A1 | 2/2014 | Chang et al. | |
| 2014/0118942 | A1 | 5/2014 | Cheng et al. | |
| 2016/0044835 | A1* | 2/2016 | Lee | H05K 1/0216 361/760 |

FOREIGN PATENT DOCUMENTS

| | | |
|---|---|---|
| CN | 204392756 U | 6/2015 |
| CN | 204408625 U | 6/2015 |
| CN | 104902041 A | 9/2015 |
| DE | 102009014852 A1 | 10/2010 |
| JP | H0613198 U | 2/1994 |
| JP | H0946080 A | 2/1997 |
| JP | H1041678 A | 2/1998 |
| JP | 2000124623 A | 4/2000 |
| JP | 2000286584 A | 10/2000 |
| JP | 2004281986 A | 10/2004 |
| JP | 2005236036 A | 9/2005 |
| JP | 2007244798 A | 9/2007 |
| JP | 2013157573 A | 8/2013 |
| KR | 101052559 B1 | 7/2011 |
| WO | 2009107303 A1 | 9/2009 |
| WO | 2016053966 A2 | 4/2016 |

OTHER PUBLICATIONS

Supplementary European Search Report in European application No. 16158530.2, dated Jan. 4, 2017.
Notification of the Decision of Allowance of Korean application No. 10-2016-7013601 with English translation, dated Nov. 27, 2017.
Notification of the First Office Action of Japanese application No. 2016-533703 with English translation, dated Nov. 21, 2017.
Notification of the Decision on Granting of Russian application No. 2016116336/28 with English translation, dated Jan. 11, 2018.
Notification of the Second Office Action of Chinese application No. 201510660841.X with English translation, dated Feb. 12, 2018.

* cited by examiner

SHIELDING CASE, PCB AND TERMINAL DEVICE

CROSS-REFERENCE TO RELATED APPLICATIONS

This application is based upon and claims priority to Chinese Patent Application No. 201510660841.X, filed on Oct. 14, 2015, the entire contents of which are incorporated herein by reference.

TECHNICAL FIELD

The present disclosure generally relates to a shield of electronic components, and more particularly, to a shielding case, a Printed Circuit Board (PCB) using the shielding case, and a terminal device using the PCB.

BACKGROUND

With the development of economy, the demand on the performance of terminal devices such as mobile phones has been growing, which leads to an increased power consumption of the electronic components; therefore, heat dissipation has become an inevitable problem that all manufacturers must resolve.

SUMMARY

According to a first aspect of an embodiment of the present disclosure, a shielding case is provided, which includes: a first shielding case body and a second shielding case body which are interconnected with each other, wherein the first shielding case body has a first top wall and a first side wall, the second shielding case body has a second top wall and a second side wall. The second shielding case body at least partially covers an outside of the first shielding case body, and a heat storage material is accommodated between the first shielding case body and the second shielding case body.

According to a second aspect of an embodiment of the present disclosure, a PCB is provided, which includes: a board body and a heating component disposed on the board body, wherein the heating component is covered by a shielding case that is described in the above embodiment of the present disclosure, and the shielding case is connected with the board body. Alternatively, the heating component is covered by a first shielding case body, the outside of which is covered by a second shielding case body. The first shielding case body and the second shielding case body are connected with the board body separately. A heat storage material is accommodated between the first shielding case body and the second shielding case body.

According to a third aspect of an embodiment of the present disclosure, a terminal device is provided, which includes the PCB described in the above embodiment of the present disclosure.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments consistent with the invention and, together with the description, serve to explain the principles of the invention.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Figure 1:
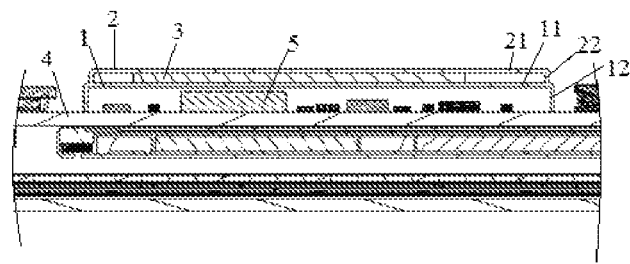
FIG. 1 is a cross-section diagram of a PCB, according to a first exemplary embodiment.
Figure 2:
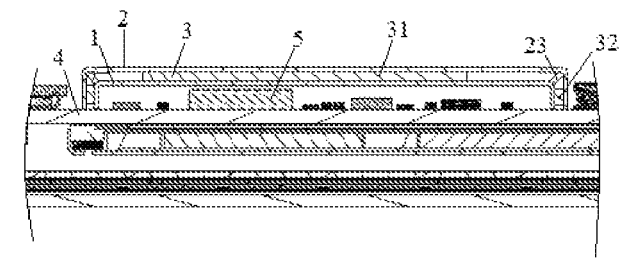
FIG. 2 is a cross-section diagram of a PCB, according to a second exemplary embodiment.
Figure 3:
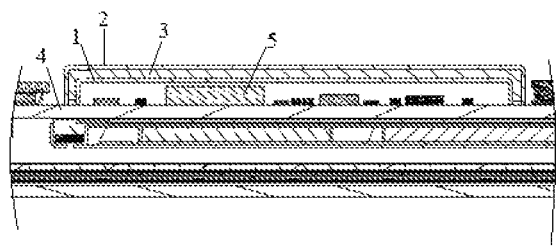
FIG. 3 is a cross-section diagram of a PCB, according to a third exemplary embodiment.

Position words employed hereinafter such as "upper, lower, left, right" generally are referring to the surface direction of the corresponding accompanying drawings if no particular description is specified, and specifically can refer to the surface direction as shown in FIG. 1 to FIG. 3. Moreover, "inner" and "outer" refer to the inner side and the outer side of the profile of a corresponding part.

As shown in FIG. 1 to FIG. 3, exemplary embodiments of the present disclosure provide a shielding case, a PCB and a terminal device, wherein the terminal device may be a device that a user often needs to hold by hand, such as a mobile phone, a computer tablet and the like. The significant heating source of the terminal device is a heating component 5 on the PCB, for example, a master chip. This type of heating component 5 will release a large amount of heat while running at a high speed. An exemplary embodiment of the present disclosure can effectively limit the impact of the heat radiation of the heating component 5 onto user experience.

In order to achieve better heat dissipation of terminal devices, first and second exemplary embodiments of the present disclosure, as shown in FIG. 1 and FIG. 2, provide a PCB, including: a board body 4 and a heating component 5 disposed on the board body 4, wherein the heating component 5 is covered by a shielding case, and the shielding case is connected onto the board body 4 by, for example, welding. The shielding case itself can shield the radiation from an element (such as the heating component 5) running at a high speed, to prevent the interference with elements; the shielding case can be made of stainless steel or copper-nickel alloy and other shielding materials.

In order to control the heat dissipation of the heating component 5, the shielding case provided in exemplary embodiments of the present disclosure includes: a first shielding case body 1 and a second shielding case body 2, which are interconnected with each other, wherein the first shielding case body 1 has a first top wall 11 and a first side wall 12, the second shielding case body 2 has a second top wall 21 and a second side wall 22. The two side walls of the shielding case body 2 can extend downwards from the top wall perpendicularly or extend slantwise slightly, to form a shield-shaped structure. The second shielding case body 2 at least partially covers the outside the first shielding case body 1, and a heat storage material 3 is accommodated between the first shielding case body 1 and the second shielding case body 2.

In this way, the heat storage material 3 accommodated between the two shielding case bodies can absorb and store the heat radiated by a heating component 5 and then dissipates the heat gradually. Therefore, the present disclosure not only realizes the dissipation of heat from the heating component 5 that is running at a high speed, but also avoids the dissipated heat being directly radiated to the outside of a terminal device to affect user experience. Moreover, the double-layer structure has large surface area for heat absorption, which strengthens the effect of heat control. In other possible embodiments, the shielding case body can be designed to contain more layers, based on the requirements for the volume of the terminal device and the heating control effect. In addition, in the exemplary embodiments of the present disclosure, the heat storage material 3 can consist of a material with a lower heat conductivity coefficient, for example, silica gel with a lower heat conductivity coefficient.

Figure 4:
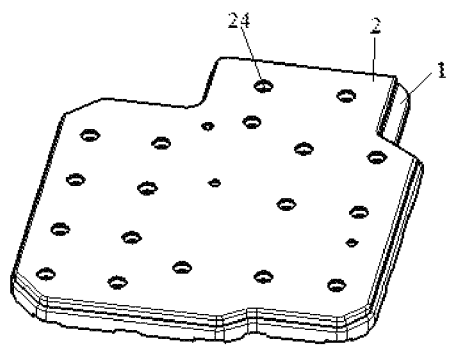
FIG. 4 is a structure stereogram of a shielding case, according to the first exemplary embodiment.

As shown in FIG. 1 and FIG. 4, in the first exemplary embodiment of the present disclosure, the second shielding case body 2 covers the outside of the first top wall 11. Thus, the top wall 11 in the first shielding case body 1 with a relatively large area bears the heat storage material 3; further, it is simple to mount the first shielding case body onto the board body 4 of the PCB, simply by welding the bottom of the first side wall 12 onto the board body 4. The two shielding case bodies can be stamped separately and then welded together; in order to have them better connected, the cross section area of the second shielding case body 2 is less than that of the first shielding case body 1. Further, the bottom of the second side wall 22 of the smaller second shielding case body 2 can be conveniently welded onto the first top wall 11 of the first shielding case body 1. In other possible embodiments, the cross section areas of the two shielding case bodies can be the same. The two shielding case bodies, or, the two shielding case bodies and the board body 4 can be connected by a demountable method such as clamping or plug-in.

As shown in FIG. 2, in the second exemplary embodiment of the present disclosure, which is different from the first embodiment shown in FIG. 1, the second shielding case body 2 covers the outside of both the first top wall 11 and the first side wall 12. In this way, when the heating component 5 is running, the heat radiated from the heating component 5 can be absorbed and stored by both the top and side walls, thus the generated heat of the terminal device can be controlled.

To connect the two shielding case bodies, in the second exemplary embodiment, the second shielding case body 2 is connected with the first shielding case body 1 through multiple joint pins 23 that are arranged along the circumference direction at intervals. The inner end of the joint pin 23 is connected with a corner between the first top wall 11 and the first side wall 12, while the outer end is connected with a corner between the second top wall 21 and the second side wall 22. In this way, the heat storage material 3 may include a first heat storage material 31 located between the first top wall 11 and the second top wall 21, for example, a plate-shaped heat storage material, and a second heat storage material 32 located between the first side wall 12 and the second side wall 22, for example, a ring-shaped heat storage material. The space between the two shielding case bodies is interconnected, because of the gaps between the multiple joint pins 23, which allows the two heat storage materials 3 to cooperate to better absorb and store the heat from the top and side walls of the heating component 5.

The first heat storage material 31 and the second heat storage material 32 can be integrated as one piece with holes for the joint pins 23 to pass through. Alternatively, the first heat storage material and the second heat storage material are independent, that is to say, they are assembled between the top walls and between the side walls of the two shielding case bodies respectively. In some possible embodiments, the two shielding case bodies can also be connected through joint rings located at the corners, and the joint pin can also be disposed on the top wall or the side wall.

In the first and second exemplary embodiments, both the shielding case bodies are of a whole structure; however, as shown in FIG. 3, in the third exemplary embodiment of the present disclosure, the two shielding case bodies may be not connected. In this way, the heating component 5 is covered by the first shielding case body 1 which is covered by the, the second shielding case body 2. The first shielding case body 1 and the second shielding case body 2 are connected onto the board body 4 respectively, for example, by welding. Moreover a heat storage material 3 is accommodated between the first shielding case body 1 and the second shielding case body 2. The third embodiment can also accomplish the heat control on the heating component 5 through the heat storage material disposed between the two shielding case bodies. In the third exemplary embodiment the structures of two shielding case bodies can be the same as or similar to the structures of two shielding case bodies in the second embodiment. Moreover, the heat storage material 3 between the two shielding case bodies can be disposed between the top walls and between the side walls at the same time, or, between top walls only in other possible embodiments.

In addition, as shown in FIG. 4, in the first exemplary embodiment of the present disclosure multiple ventilation holes 24 are distributed at intervals on the second shielding case body 2. Through the ventilation holes, the heat storage material can dissipate heat after absorbing and storing the heat, thereby reducing the heat absorption load of the heat storage material. Likewise, similar ventilation holes 24 can be formed on the second shielding case body 2 in other embodiments. In addition, the shape of the shielding case body can be designed according to the number and layout of the electronic elements to be covered.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims It will be appreciated that the present invention is not limited to the exact construction that has been described above and illustrated in the accompanying drawings, and that various modifications and changes can be made without departing from the scope thereof.

It is intended that the scope of the invention is only limited by the appended claims.

What is claimed is:

1. A shielding case, comprising: a first shielding case body and a second shielding case body which are interconnected with each other and form a double-layer structure, wherein the first shielding case body comprises a first top wall and a first side wall, the second shielding case body comprises a second top wall and a second side wall, the second shielding case body at least partially covers an outside of the first shielding case body, and a heat storage material is accommodated between the first shielding case body and the second shielding case body, such that heat radiated by a heating component covered by the double-layer structure is stored in and then dissipated from the heat storage material;

wherein the second shielding case body covers an outside of both the first top wall and the first side wall; and wherein the second shielding case body is connected with the first shielding case body through multiple joint pins that are arranged along a circumference direction at intervals; an inner end of the joint pin is connected with a corner between the first top wall and the first side wall, while an outer end is connected with a corner between the second top wall and the second side wall; the heat storage material comprises a first heat storage material located between the first top wall and the second top wall and a second heat storage material located between the first side wall and the second side wall.

2. The shielding case according to claim 1, wherein the second shielding case body covers an outside of the first top wall.

3. The shielding case according to claim 2, wherein a cross section area of the second shielding case body is less than that of the first shielding case body, and a bottom of the second side wall is welded on the first top wall.

4. The shielding case according to claim 1, wherein multiple ventilation holes distributed at intervals are formed on the second shielding case body.

5. A Printed Circuit Board (PCB), comprising: a board body and a heating component disposed on the board body,
wherein a shielding case covers the heating component, and the shielding case is connected onto the board body;
wherein the shielding case comprises: a first shielding case body and a second shielding case body which are interconnected with each other and form a double-layer structure, wherein the first shielding case body comprises a first top wall and a first side wall, the second shielding case body comprises a second top wall and a second side wall, the second shielding case body at least partially covers an outside of the first shielding case body, and a heat storage material is accommodated between the first shielding case body and the second shielding case body, such that heat radiated by a heating component covered by the double-layer structure is stored in and then dissipated from the heat storage material;
wherein the second shielding case body covers an outside of both the first top wall and the first side wall; and
wherein the second shielding case body is connected with the first shielding case body through multiple joint pins that are arranged along a circumference direction at intervals; an inner end of the joint pin is connected with a corner between the first top wall and the first side wall, while an outer end is connected with a corner between the second top wall and the second side wall; the heat storage material comprises a first heat storage material located between the first top wall and the second top wall and a second heat storage material located between the first side wall and the second side wall.

6. The PCB according to claim 5, wherein the second shielding case body covers an outside of the first top wall.

7. The PCB according to claim 6, wherein a cross section area of the second shielding case body is less than that of the first shielding case body, and a bottom of the second side wall is welded on the first top wall.

8. The PCB according to claim 5, wherein multiple ventilation holes distributed at intervals are formed on the second shielding case body.

9. The PCB according to claim 5, wherein the first shielding case body, the second shielding case body and the board body are connected by at least one of: welding, clamping and plug-in.

10. The PCB according to claim 9, wherein bottoms of the first side wall and the second side wall are welded onto the board body.

11. A terminal device, comprising: a Printed Circuit Board (PCB) provided in the terminal device,
wherein the PCB comprises: a board body and a heating component disposed on the board body,
wherein a shielding case covers the heating component, and the shielding case is connected onto the board body;
wherein the shielding case comprises: a first shielding case body and a second shielding case body which are interconnected with each other and form a double-layer structure, wherein the first shielding case body comprises a first top wall and a first side wall, the second shielding case body comprises a second top wall and a second side wall, the second shielding case body at least partially covers an outside of the first shielding case body, and a heat storage material is accommodated between the first shielding case body and the second shielding case body, such that heat radiated by a heating component covered by the double-layer structure is stored in and then dissipated from the heat storage material;
wherein the second shielding case body covers an outside of both the first top wall and the first side wall; and
wherein the second shielding case body is connected with the first shielding case body through multiple joint pins that are arranged alone a circumference direction at intervals; an inner end of the joint pin is connected with a corner between the first top wall and the first side wall, while an outer end is connected with a corner between the second top wall and the second side wall; the heat storage material comprises a first heat storage material located between the first top wall and the second top wall and a second heat storage material located between the first side wall and the second side wall.

12. The terminal device according to claim 11, wherein the second shielding case body covers an outside of the first top wall.

13. The terminal device according to claim 12, wherein a cross section area of the second shielding case body is less than that of the first shielding case body, and a bottom of the second side wall is welded on the first top wall.

14. The terminal device according to claim 11, wherein multiple ventilation holes distributed at intervals are formed on the second shielding case body.

* * * * *